(12) United States Patent
Leger

(10) Patent No.: US 12,471,260 B2
(45) Date of Patent: Nov. 11, 2025

(54) IGBT TEMPERATURE DAMPENING SYSTEMS AND METHODS

(71) Applicant: The ESAB Group, Inc., North Bethesda, MD (US)

(72) Inventor: Erik Anthony Leger, Newmarket, NH (US)

(73) Assignee: THE ESAB GROUP, INC., North Bethesda, MD (US)

( * ) Notice: Subject to any disclaimer, the term of this patent is extended or adjusted under 35 U.S.C. 154(b) by 259 days.

(21) Appl. No.: 18/322,099

(22) Filed: May 23, 2023

(65) Prior Publication Data

US 2024/0397678 A1 Nov. 28, 2024

(51) Int. Cl.
*H05K 7/20* (2006.01)
*H05H 1/28* (2006.01)

(52) U.S. Cl.
CPC ........... *H05K 7/20927* (2013.01); *H05H 1/28* (2013.01); *H05K 7/20263* (2013.01)

(58) Field of Classification Search
CPC ............... H05K 3/325; H05K 7/20272; H05K 7/20927; H05K 7/20209; H05K 2201/064; H05K 2201/10166; H05K 7/14325; H05K 7/20145; H05K 7/20263; H05K 7/20281
See application file for complete search history.

(56) References Cited

U.S. PATENT DOCUMENTS

| | | | |
|---|---|---|---|
| 3,213,929 A | 10/1965 | Marshall et al. | |
| 5,642,260 A | 6/1997 | Sigl | |
| 6,081,423 A | 6/2000 | Griffin | |
| 6,109,346 A | 8/2000 | Hill | |
| 6,553,827 B2 | 4/2003 | McCormick | |
| 6,888,099 B1 | 5/2005 | Schneider | |
| 7,470,872 B2 | 12/2008 | Griffin | |
| 7,800,901 B2 | 9/2010 | Borowy et al. | |
| 8,188,405 B2 | 5/2012 | Martin et al. | |
| 9,474,185 B2 | 10/2016 | Jochman | |
| 9,950,387 B2 | 4/2018 | Kamath et al. | |
| 10,610,983 B2 | 4/2020 | Melius et al. | |

(Continued)

FOREIGN PATENT DOCUMENTS

| | | |
|---|---|---|
| CN | 113732570 A | 12/2021 |
| CN | 115800770 A | 3/2023 |

(Continued)

OTHER PUBLICATIONS

Pub: Nov. 9, 2022; Title: Water cooling system and method of traction converter, controller and traction system (Year: 2022).*

(Continued)

*Primary Examiner* — Wei (Victor) Y Chan
(74) *Attorney, Agent, or Firm* — Edell, Shapiro & Finnan, LLC

(57) ABSTRACT

Systems and methods for controlling the junction temperature of one or more IGBTs that are configured to deliver current to an electrode of a torch. The IGBTs are cooled by a fluid that flows through a heat exchanger where the fluid is cooled. According to one aspect, when the IGBTs are turned off to cease the delivery of current to the electrode, or at a time interval before the IGBTs are turned off, at least a portion of the fluid is diverted away from the heat exchanger for the purpose of reducing junction temperature fluctuations in the IGBTs.

11 Claims, 8 Drawing Sheets

(56) References Cited

U.S. PATENT DOCUMENTS

| | | | |
|---|---|---|---|
| 10,897,807 | B2 | 1/2021 | Raymond |
| 10,925,194 | B2 | 2/2021 | Dessart |
| 11,006,552 | B2 | 5/2021 | Jochman |
| 2001/0047864 | A1 | 12/2001 | Sloan et al. |
| 2015/0114021 | A1* | 4/2015 | Oguri .................. H01L 23/473 |
| | | | 62/259.2 |
| 2016/0128231 | A1* | 5/2016 | Wagoner ............ H05K 7/20927 |
| | | | 165/104.31 |
| 2016/0136748 | A1 | 5/2016 | Lee et al. |
| 2016/0136749 | A1* | 5/2016 | Lee ..................... B23K 9/1006 |
| | | | 219/130.1 |
| 2020/0100351 | A1* | 3/2020 | Raymond .......... H05K 7/20163 |
| 2020/0384564 | A1 | 12/2020 | Klein |
| 2021/0392792 | A1 | 12/2021 | Jochman |

FOREIGN PATENT DOCUMENTS

| | | |
|---|---|---|
| JP | H04105775 A | 4/1992 |
| WO | 9915767 A1 | 4/1999 |

OTHER PUBLICATIONS

Title: Water cooling system and method of traction converter, controller and traction system, Pub: Nov. 9, 2022 (Year: 2022).*
Notification of Transmittal of International Search Report and Written Opinion including International Search Report and Written Opinion mailed Sep. 17, 2024, 15 pages.

* cited by examiner

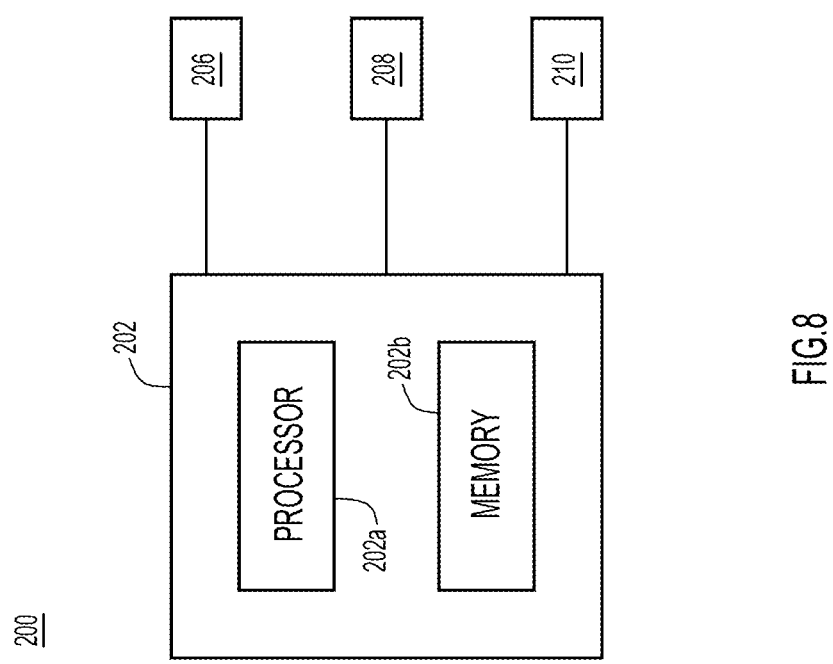

IGBT TEMPERATURE DAMPENING SYSTEMS AND METHODS

FIELD

This application relates to systems and methods for dampening junction temperature fluctuations in insulated gate bipolar transistors used in inverter modules that supply power to an electrode of a plasma cutting torch. More particularly, the application relates to lessening/reducing changes in insulated gate bipolar transistor (IGBT) junction temperature as the IGBT transitions between on and off states.

BACKGROUND

An insulated gate bipolar transistor is used in power supply inverter modules to rectify alternating current (AC) current to direct current (DC) at very high switching rates. Inverter modules employing IGBTs are widely known and used in the field of plasma torches for the purpose of delivery power to an electrode of a plasma torch. For this reason, the manner in which the IGBTs function in inverter modules will not be discussed herein.

A general configuration of an IGBT is illustrated in FIG. 1. The IGBT 10 includes a collector terminal 11, an emitter terminal 12, and a control terminal (i.e. gate terminal) 13. The IGBT is a multilayer device that includes a P body region 14, an N− drift region 15, a N+ buffer 16 and P+ substrate. Disclosed herein are systems and methods for dampening temperature fluctuations in the junction of the IGBT. The junction temperature as used herein is a temperature anywhere in the afore-described multilayer device.

As shown schematically in FIG. 1, an IGBT typically includes a cover/housing 20 to which the IGBT structure (as described above) is thermally coupled. This allows heat inside the IGBT junction to be controlled by transferring heat through the cover 20 to a cooling plate to which the cover is thermally coupled.

IGBTs currently used to deliver current to plasma torch electrodes are much more sensitive to junction temperature fluctuation than they are to absolute temperature experienced. This generates problems involving thermal design, given that it is now junction temperature fluctuations that most greatly impact the life of these current-day IGBTs.

FIG. 2 is an example showing the lifetime expectancy of an IGBT (y-axis) at varying differential junction temperatures $\Delta T_j$ (x-axis). In the example of FIG. 2, the lifetime is measured by the number of cycles the IGBT is turned on (current flowing through the IGBT) and off (current not flowing through the IGBT). As also expressed in FIG. 2, the junction temperature of an IGBT must also be controlled not to exceed a maximum critical temperature ($T_j$max) and not drop below a minimum critical temperature limit ($T_j$min). What FIG. 2 shows is that the life time of an IGBT decreases as the $\Delta T_j$ it experiences during operation increases.

Plasma cutting operations involve the generation of a plasma arc at an end of a plasma torch. The general features of a plasma torch are discussed below. During a starting of the torch, the inverter modules of the power supply are used to direct current to the torch electrode through the IGBTs to initiate the plasma arc. FIG. 3 shows the fluctuation of an IGBT junction temperature over time during an example torch cutting operation. In the example of FIG. 3 current through the IGBT is turned on and off in a cyclic manner. This is done while the IGBT is being cooled by a cooling plate that is cooled by a fluid exiting a heat exchanger. In the example shown, current to the torch is supplied over about an eight minute time period and no current is supplied to the torch over about a two minute time period. Curve 30 shows the IGBT junction temperature as current is being supplied through the IGBT ($C_{on}$) and after current flow is terminated ($C_{off}$). As shown in FIG. 3, in the time period between cuts (during $C_{off}$) the junction temperature of the IGBT drops dramatically by about 70° C. to create a large $\Delta T_j$. This dramatic decrease in temperature is brought about by the sudden cessation of current running through the IGBTs and is compounded by the continued cooling of the IGBTs by the fluid passing through the heat exchanger. As evidenced by FIG. 2, such a fluctuation in junction temperature can dramatically reduce the expected life of the IGBT.

What is needed are systems and methods for dampening junction temperature fluctuations in IGBTs as they are turned on and off during plasma cutting operations.

SUMMARY

Disclosed herein are systems and methods for lessening/reducing changes in IGBT junction temperature as the IGBT is turned on and off during plasma cutting operations.

According some implementations a system is includes a power supply in which an IGBT is configured to deliver current to an electrode of a plasma torch. The IGBT is thermally coupled to a cooling plate that is cooled by a fluid exiting a heat exchanger.

According to one aspect, the $\Delta T_j$ of the IGBT is reduced with respect to curve 30 of FIG. 3 during $C_{off}$ (a time period when current flowing to the IGBT is terminated) by diverting some or all of the fluid away from the heat exchanger through a heat exchanger bypass conduit so that some or all of the fluid passes to the cooling plate without being cooled by the heat exchanger.

According to some implementations the heat exchanger is a radiator that incudes coils through which the fluid passes. The radiator is equipped with a motor driven fan that forces air across the coils to cause a cooling of the fluid as it travels through the coils. According to another aspect, the $\Delta T_j$ of the IGBT is reduced with respect to curve 30 of FIG. 3 during $C_{off}$ by terminating power to the fan motor.

According to one implementation the system includes: (1) a cover of an IGBT thermally coupled to a cooling plate; (2) a tank for storing a fluid, the tank having a fluid inlet and a fluid outlet; (3) a pump located downstream the tank that is configured to circulate the fluid; (4) a heat exchanger located upstream the cooling plate that is configured to cool the fluid; (5) a heat exchanger bypass conduit having an inlet and an outlet, the inlet of the bypass conduit being located upstream a fluid inlet of the heat exchanger, the outlet of the bypass conduit being located between a fluid outlet of the heat exchanger and a fluid inlet of the cooling plate; (6) a valve (sometimes referred to herein as a "bypass valve") located in the heat exchanger bypass conduit that is configured to transition between at least first and second positions. A fluid outlet of the cooling plate is located upstream and in fluid communication with the fluid inlet of the tank. Hence, when the pump is operating the fluid recirculates through the tank.

According to some implementations the bypass conduit and valve are configured such that when the valve is in the first position at least a majority of the fluid flows through the heat exchanger and when the valve is in the second position at least a majority of the fluid flows through the bypass conduit.

According to one implementation the bypass valve is configured such that when it is in the first position no fluid is permitted to pass through the heat exchanger bypass conduit.

According to some implementation the bypass valve is electrically actuated to assume one or both of the first and second positions.

According to one implementation the system includes a controller that is configured to cause the valve to assume the second position upon the plasma arc being extinguished by a termination of the delivery of current through the IGBT. This results in at least a portion of the fluid being diverted away from the heat exchanger and into the bypass conduit. By diverting fluid flow away from the heat exchanger after current through the IGBT is terminated, the fluid passing through the cooling plate is warmer. This reduces the rate at which the junction temperature of the IGBT drops in comparison to the example of FIG. 3 (curve 30) discussed above. Curve 32 of FIG. 3 illustrates an example junction temperature over time wherein the junction temperature fluctuations are diminished with respect to the fluctuations shown by curve 30 when at least a part of the fluid is diverted away from the heat exchanger.

The method further includes reinitiating the delivery of current through the IGBT to the torch electrode when the $C_{off}$ time interval has ended and the $C_{on}$ time interval begins. When this occurs, the bypass valve is caused to again assume the first position such that at least a majority or all of the fluid again passes through the heat exchanger.

According to another implementation the controller is configured to cause the valve in the bypass conduit to assume the second position at a time interval before a designated time for the plasma arc to be extinguished by a termination of the delivery of current through the one or more IGBTs. Plasma arc cutting torches are typically managed by a controller that is preprogrammed to control (among other features) the positioning of the plasma torch and the delivery of power to the torch electrode in order to produce a desired cut in a workpiece. The controller typically generates an "end of cut" signal to instruct the power supply to cease the delivery of current to the electrode when the cut is considered complete. By virtue of the controller knowing when an "end of cut" is to occur, it can be programmed to, directly or indirectly, cause an opening of the bypass valve at a time interval before the "end of cut" to cause at least some of the fluid to be diverted away from the heat exchanger. According to one implementation 50% to 100% of the fluid is diverted away from the heat exchanger. In doing this, the time interval can be selected to cause an increase in temperature of the fluid in the tank before the delivery of current through the IGBTs is terminated. In this way heat energy is caused to be stored in the fluid tank before current to the IGBTs is terminated. This results in a warmer fluid being circulated through the fluid circuit at the time IGBT current is terminated. Because the IGBT cooling plates are operated at a warmer temperature compared to the example curve 30 of FIG. 3, the junction temperature of the IGBTs attached to them will drop a smaller amount as illustrated by the junction temperature curve 32 shown in FIG. 3. The method further includes reinitiating the delivery of current through the IGBT to the torch electrode when the $C_{off}$ time interval has ended and the $C_{on}$ time interval begins. When this occurs, the bypass valve is caused to assume the first position such that at least a majority or all of the fluid again passes through the heat exchanger.

According to some implementations the heat exchanger is a radiator having a cooling fan that forces air over the radiator coils that carry the fluid. The fan is driven by an electric motor and the controller is configured to turn the fan motor on and off based on the state of the IGBTs. According to one implementation the controller is configured to cause a cessation of power to the fan motor during a time the IGBTs are powered off. According to some implementations this occurs in addition to causing the bypass valve to assume the second position.

According to another implementation, the system is devoid of a radiator bypass conduit and the IGBT junction temperature fluctuations ($\Delta T_j$) are controlled by turning the radiator fan motor on and off at selected times. According to one implementation this involves turning the fan motor off at or near the time current flow to the torch electrode is terminated (i.e. at the onset of $C_{off}$). According to another implementation this involves turning the fan motor off at a time interval before current flow to the torch electrode is terminated. In each of these implementations the cooling of the fluid passing through the radiator is substantially diminished resulting in a warmer fluid being circulated through the fluid circuit at the time IGBT current is terminated. As explained above, because the IGBT cooling plates are operated at a warmer temperature compared to the example curve 30 of FIG. 3, the junction temperature of the IGBTs attached to them will drop a smaller amount as shown by the example curve 40 of FIG. 4.

According to other implementations IGBT junction temperature fluctuations can be managed by regulating the pump that circulates the fluid through the circuit. This can be an "on" and "off" regulation wherein power to the pump is turned off at the time of or at a time interval after terminating power to the IGBTs. According to some implementations, the pump is a variable flow pump that is controllable to vary the flow rate of the fluid in the circuit. In such implementations the flow rate of the fluid may be reduced at the time of or at a time interval after terminating power to the IGBTs.

The IGBT junction temperatures fluctuations may be managed using any one of the methods disclosed above or any combination thereof.

These and other advantages and features will become apparent in view of the figures and detailed description.

BRIEF DESCRIPTION OF THE DRAWINGS

FIG. 8 illustrates a control circuit that includes a controller for regulating the position of a bypass valve and/or regulating power to a radiator fan motor and/or regulating the fluid flow output of a fluid pump.

DETAILED DESCRIPTION

For discussion purposes, the disclosure that follows is primarily directed to plasma cutting torches, but is nonetheless applicable to welding torches and to other types of cutting torches to which current is delivered using one or more IGBTs.

Figure 7:
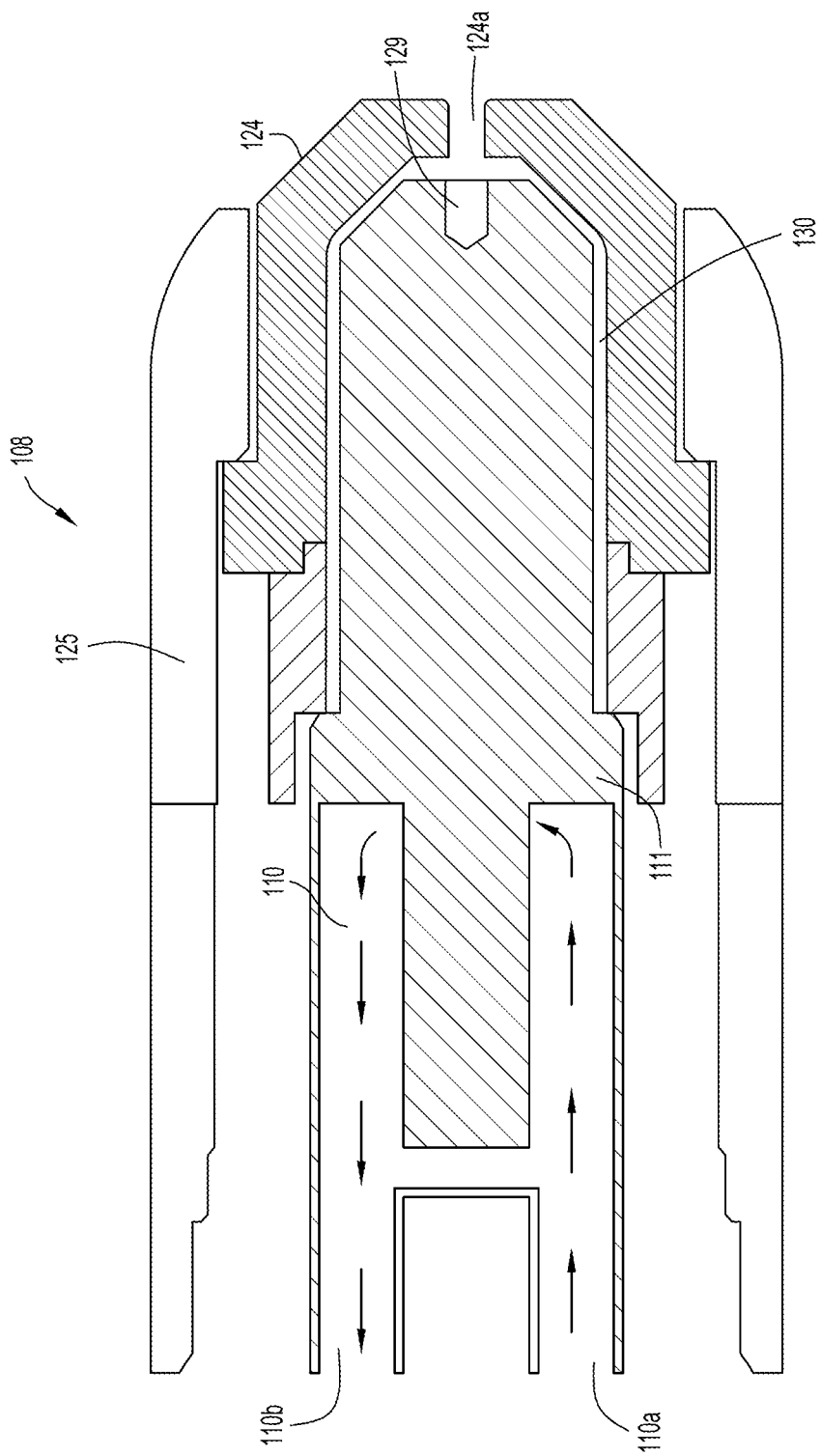
FIG. 7 illustrates an end of a plasma torch that includes a cooling channel through which fluid flows to cool the torch electrode.

FIG. 7 is a generic illustration of a distal end portion of a torch 108 according to one implementation. For simplicity, FIG. 7 illustrates the torch 108 without various components or parts, such as power or gas transfer components, that are typically included in a plasma cutting torch. Instead, FIG. 7 only illustrates select components or parts that allow for a clear and concise understanding of the systems and methods disclosed herein. In the depicted implementation, the torch 108 includes a number of parts, such as, for example, the electrode 111, a nozzle 124 and a shield cup 125. A distal-most end of the nozzle 124 includes an orifice 124a. Located in a distal end portion of the electrode 111 is an emitter 129.

In use, the plasma torch 108 is configured to emit a plasma arc between the electrode 111 and a workpiece to which a grounding clamp is typically attached. As shown in FIG. 7, the torch tip 124 is spaced a distance away from the electrode 111 with there being a process gas flow channel 130 disposed between them. During initiation, current is first supplied by IGBTs 101a, 101b, 101c to the nozzle 124 (anode) to generate an arc between the nozzle 124 and the electrode 111 (cathode) across the process gas flow channel 130. As process gas flows through channel 130 during arc initiation it is ionized to form an electrically conductive plasma that is then directed out the orifice 124a of the nozzle 124 towards an electrically conductive workpiece (not shown). Once this occurs, power is transferred to the electrode 111 with current being delivered to the electrode through the IGBTs. This establishes an electrical circuit between the power source and the ground to which the workpiece is coupled. A plasma arc that closes the electrical circuit is thus established between the electrode 111 and the workpiece, the plasma arc being sufficient to cut through the workpiece by a localized melting of the material from which the workpiece is made. When power is supplied to the electrode 111, power to the nozzle 124 is terminated. When a cut, piercing or marking operation is complete, the plasma arc is extinguished by terminating current flow from the IGBTs 101a, 101b, 101c to the electrode 111.

Figure 5:
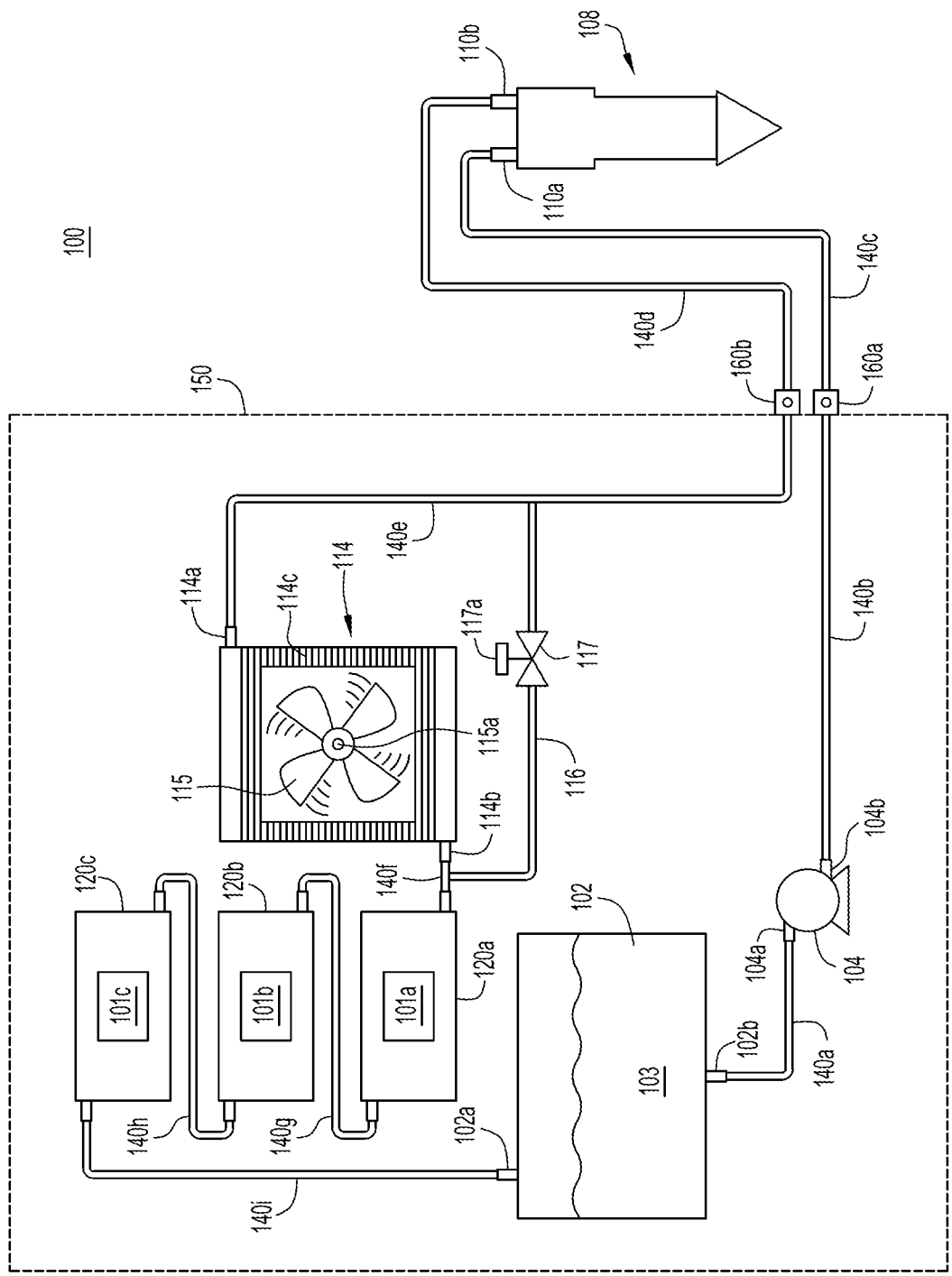
FIG. 5 is a schematic of a fluid circuit according to one implementation.
Figure 6:
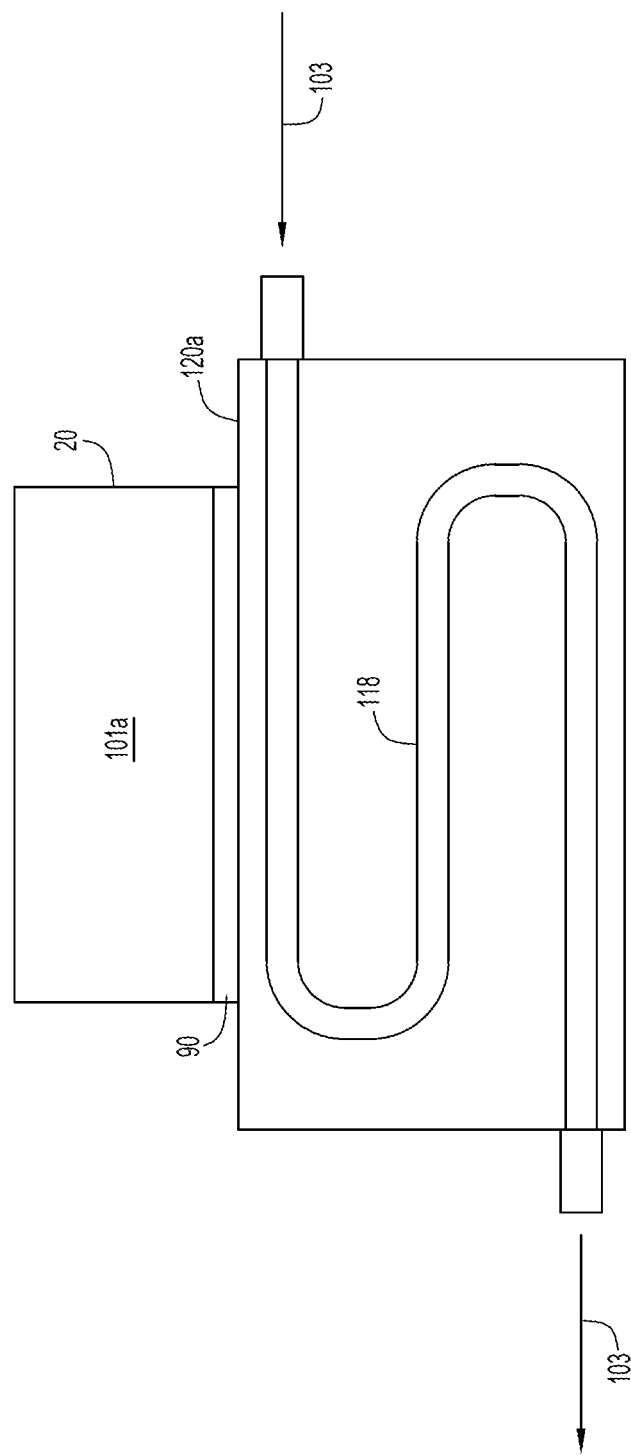
FIG. 6 is a side view of an IGBT thermally coupled to a cooling plate according to one implementation.

Various systems and methods for lessening/reducing changes in IGBT junction temperature as an IGBT is turned on and off are disclosed. FIG. 5 illustrates an example plasma cutting system 100 in which the techniques presented herein may be carried out. The depicted cutting system 100 includes a power supply possessing one or more IGBTs that are configured to deliver current to the electrode 111 of the plasma torch 108. In the example of FIG. 5 there are three IGBTs 101a, 101b, 101c that are respectively thermally coupled to cooling plates 120a, 120b, 120c. As shown in FIG. 6, according to some implementations the one or more cooling plates are thermally coupled to tubing 118 (attached to or embedded therein) through which a fluid 103 flows after having passed through a heat exchanger 114. FIG. 6 illustrates the cooling plate 120c to which IGBT 101a is thermally coupled. As shown in FIG. 6, the cover 20 of the IGBT may be thermally coupled to the cooling plate by use of a thermally conductive grease 90 or any other method known in the art.

The system includes a fluid circuit that includes a tank 102 for storing the fluid 103, the tank having a fluid inlet 102a and a fluid outlet 102b. According to some implementations the fluid is water or a water glycol solution. Located downstream and in fluid communication with the fluid outlet 102b of the tank 102 is a pump 104 that is configured to produce a pressurized fluid flow at the pump outlet 104b. The pump outlet 104b is located upstream and in fluid communication with an inlet 110a of a cooling channel 110 located inside a plasma torch 108. The cooling channel 110 is arranged to put the fluid 103 in contact with at least a portion of the electrode 111 for the purpose of cooling the electrode when the torch is in use.

The heat exchanger 114 is configured to cool the fluid 103 before the fluid is delivered to the cooling plates 120a, 120b, 120c through tubing 118. The heat exchanger 114 has a fluid inlet 114a that is located downstream and in fluid communication with an outlet 110b of the torch cooling channel 110. The tubing 118 is located downstream and in fluid communication with the fluid outlet 114b of the heat exchanger.

To complete the circuit, the tank inlet 101a is located downstream and in fluid communication with the tubing 118 through fluid conduit 140i. In the example of FIG. 5, multiple fluid conduits 140a-i are used to connect the various fluid circuit components.

Figure 1:
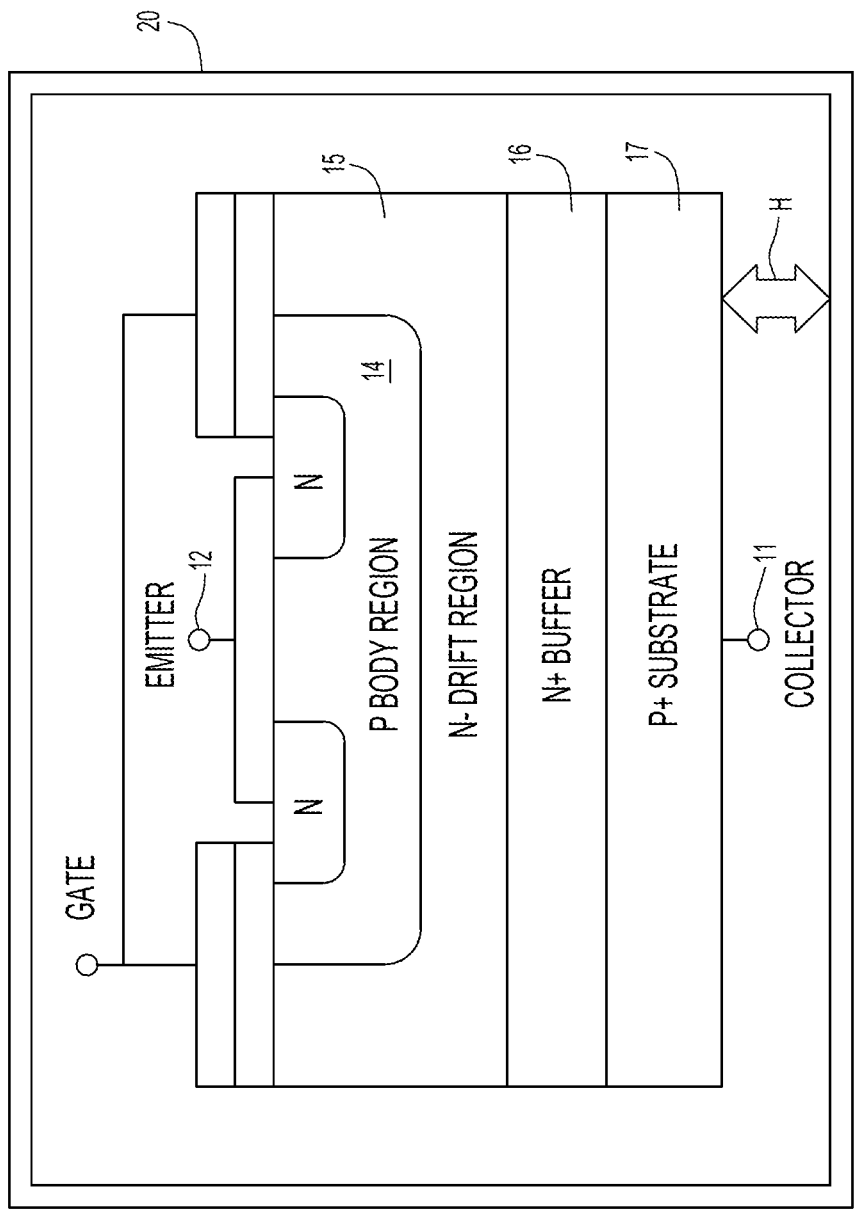
FIG. 1 is a schematic of an IGBT according to one implementation.
Figure 2:
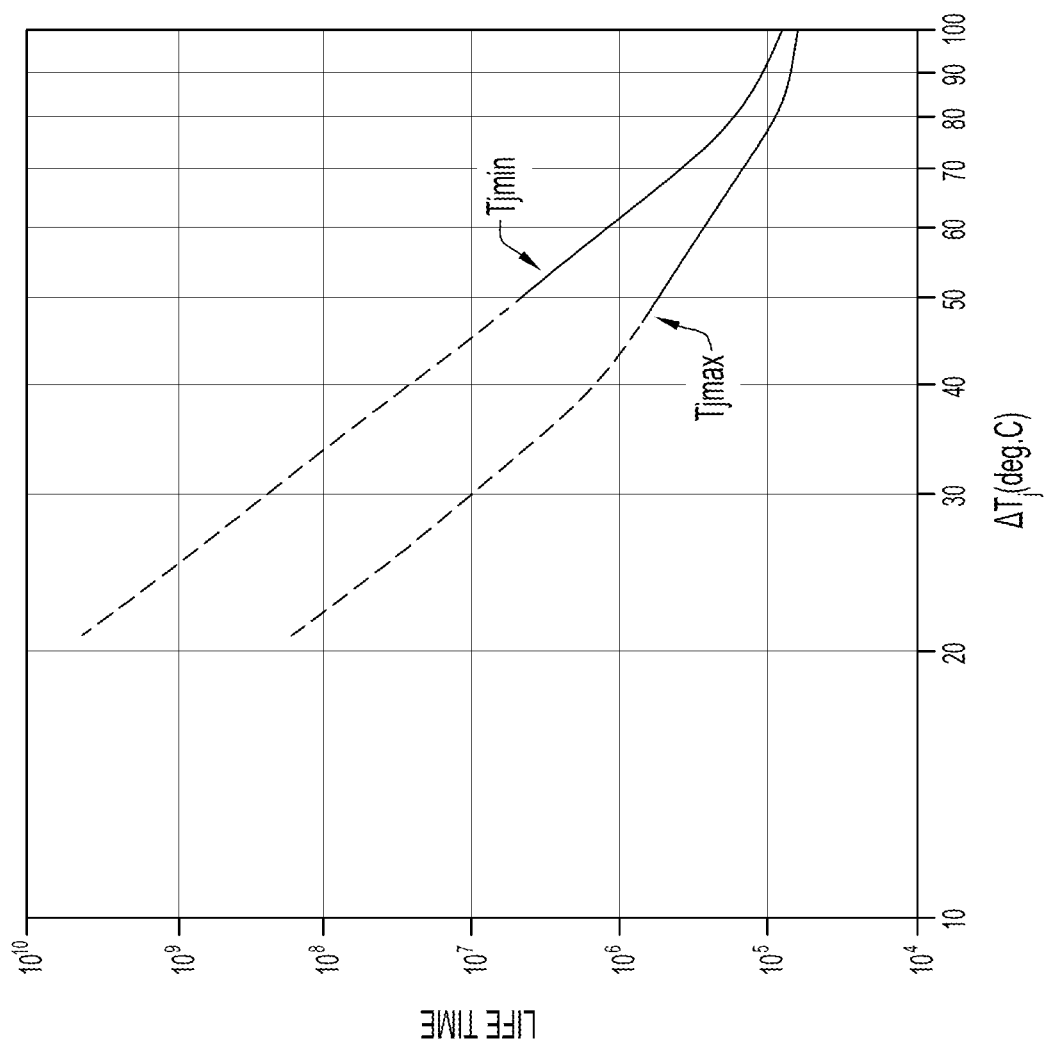
FIG. 2 is a graph showing the effect of IGBT junction temperature fluctuations on the expected life of the IGBT.
Figure 3:
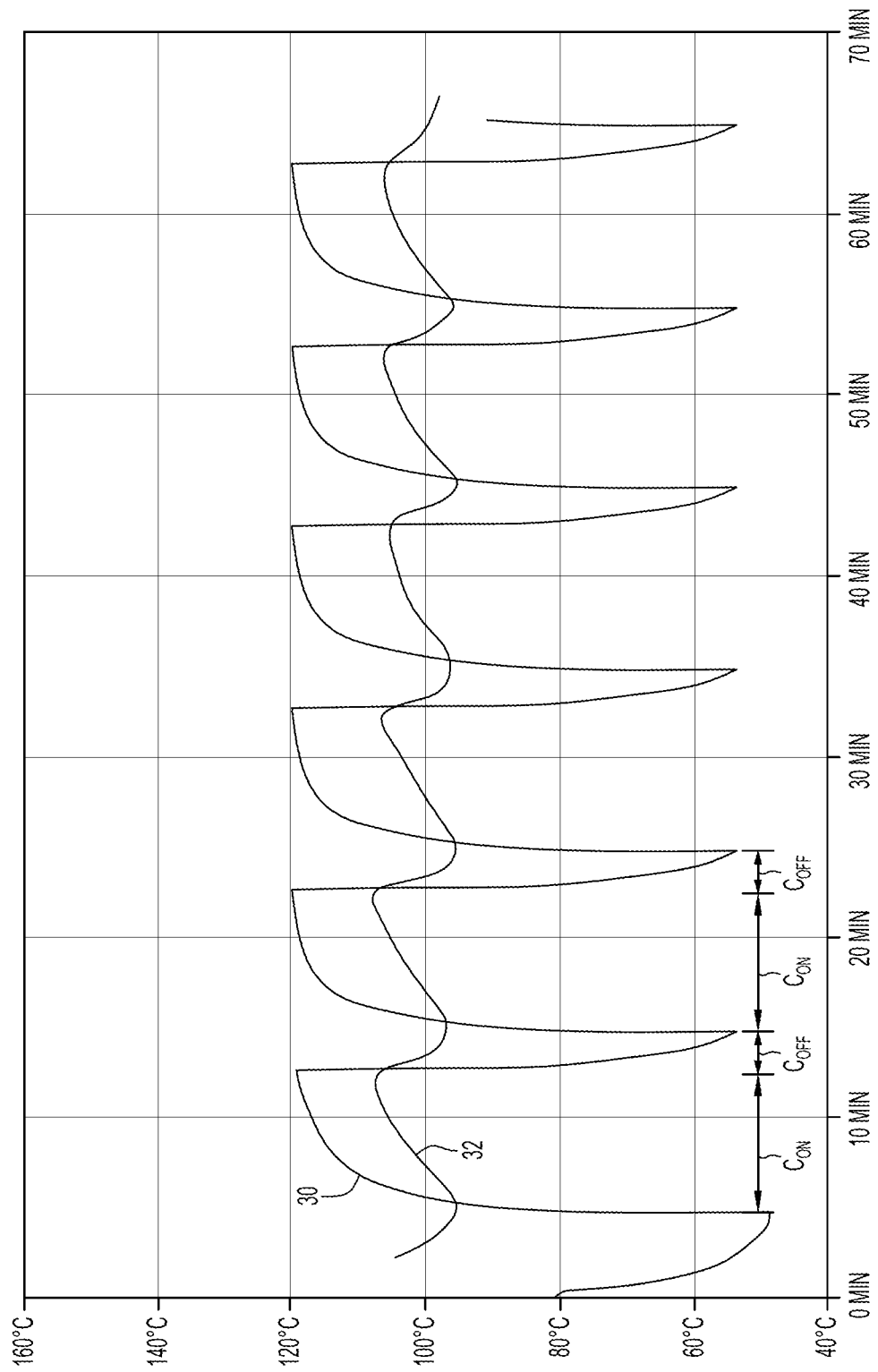
FIG. 3 is a graph showing IGBT junction temperature changes over time as current through the IGBTs is turned on and off with and without fluid flow bypassing the heat exchanger.
Figure 4:
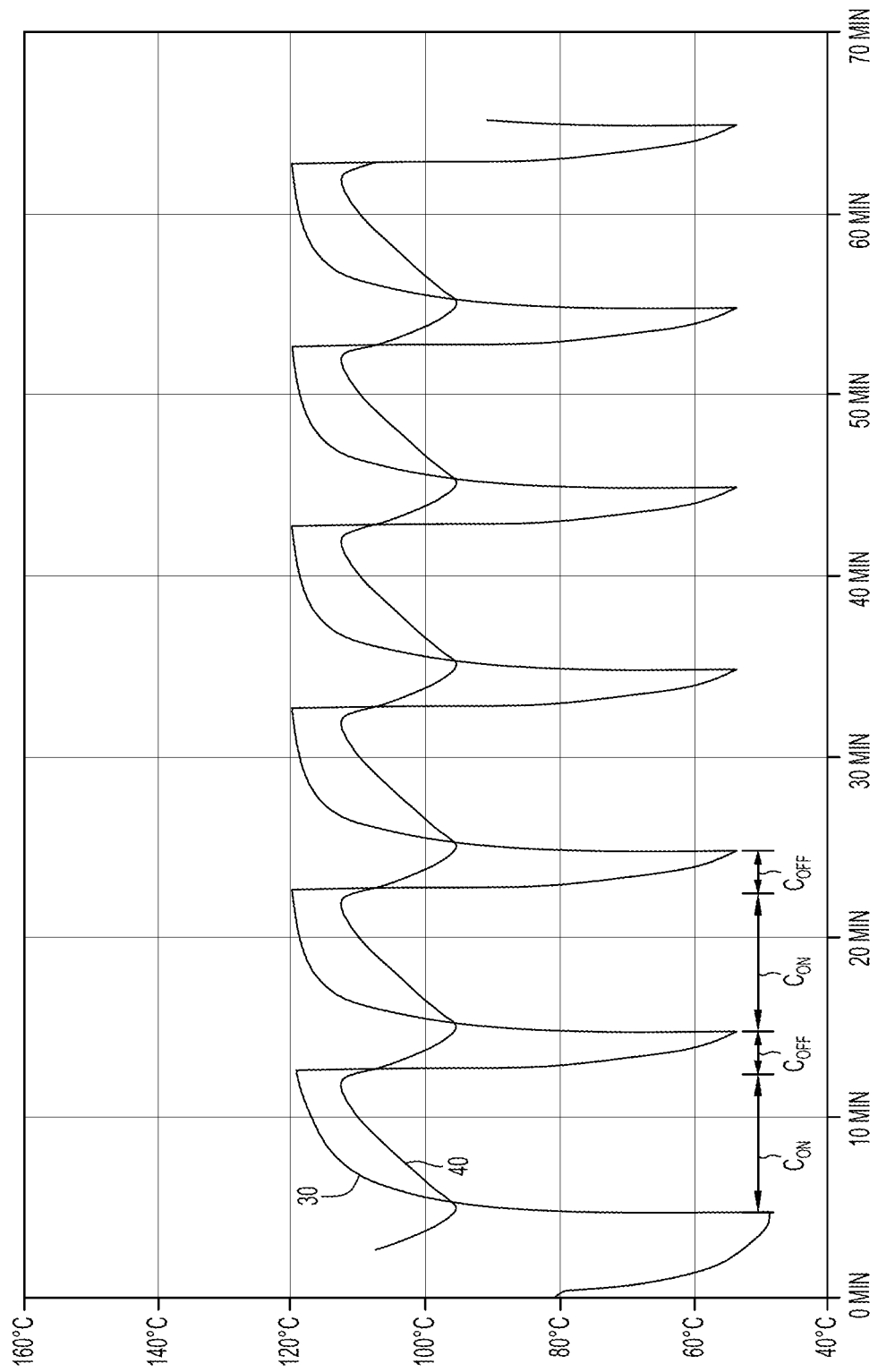
FIG. 4 is a graph showing IGBT junction temperature changes over time as current through the IGBTs is turned on and off with and without forced air flowing through the coils of a radiator.

As discussed above and as shown in curve 30 of FIG. 3, when the fluid circuit is operated in a conventional way the junction temperature of the IGBTs dramatically drop to create a large $\Delta T_j$ when current ceases to flow through the IGBTs. This dramatic decrease in temperature is brought about by the sudden cessation of current running through the IGBTs and is compounded by the continued cooling of the IGBTs by the fluid passing through the heat exchanger 114.

According to one implementation, a reducing of the $\Delta T_j$ is achieved through the use of a heat exchanger bypass conduit 116 that extends across conduits 140e and 140f. Located in the bypass conduit 116 is a valve 117 that is configured to transition between at least first and second positions. According to some implementations the bypass conduit 116 and valve 117 are configured such that when the valve is in the second position a first amount of the fluid is diverted away from the heat exchanger 114 and flows through the bypass conduit 116. According to some implementations, when the valve 117 is in the first position no fluid is permitted to pass through the valve and no fluid flows through the heat exchanger bypass conduit 116. According to other implementations, when the valve 117 is in the first position at least a majority of the fluid flows through the heat exchanger 114 and when the valve is in the second position at least a majority of the fluid flows through the bypass conduit 116. By reducing fluid flow through the heat exchanger 114, the fluid 103 passing through the cooling plates 120 is at a warmer temperature and results in a lower junction temperature drop in the IGBTs as shown by curve 32 of FIG. 3.

According to one implementation, when the valve 117 is in the second position all or substantially all (90% or more) of the fluid 103 passes through the bypass conduit 116 and when the valve is in the first position all or substantially all (90% or more) of the fluid 103 passes through the heat exchanger 114.

According to some implementation the valve 117 is operated by the use of a controller 202 that forms a part of a control circuit 200. According to some implementations the controller 200 comprises a processor 202a and memory 202b for storing instructions to be implemented by the processor. According to one implementation the valve 117 is an electrically actuated valve, such as a solenoid valve, that when energized assumes the second position. As shown in FIG. 8, the controller 202 may be configured to control the open and closed position of a switch 206 that controls the delivery of power to the valve actuator 117a.

As discussed above, according to some implementation the controller 202 is configured to cause the valve 117 in the bypass conduit 116 to assume the second position at a time interval before a designated time for the plasma arc to be extinguished by a termination of the delivery of current through the one or more IGBTs. That is, fluid 103 is at least partially diverted away from the heat exchanger 114 while current continues to flow through the IGBTs to the torch electrode 111. According to some implementations at least a majority of the fluid 103 is diverted away from the heat exchanger 114 when the valve is in the second position. The time interval is selected to cause an increase in temperature of the fluid 103 in the tank 102 before the delivery of current through the IGBTs is terminated. In this way heat energy is caused to be stored in the tank 102 before current to the IGBTs is terminated. As explained above, this results in a warmer fluid being circulated through the fluid circuit at the time IGBT current is terminated. Because the IGBT cooling plates are operated at a warmer temperature compared to the example curve 30 of FIG. 3, the junction temperature of the IGBTs attached to them will drop a smaller amount as illustrated by the junction temperature curve 32 shown in FIG. 3.

According to some implementations at the onset of the time interval before the IGBTs are turned off, valve 117 is opened a first amount to enable a first flow rate of the fluid through the bypass conduit 116 while at least some of the fluid continues to flow through the heat exchanger 114. Thereafter, when the IGBTs are turned off ($C_{off}$), the valve 117 is opened a second amount greater than the first amount to enable a majority, substantially all (≥905), or all of the fluid 103 to pass through the bypass conduit 116. This procedure guards against an excessive increase in the junction temperature of the IGBTs during the time interval that could occur with a complete opening of the valve 115. According to some implementations the processor 202a of the controller 200 executes instructions stored in memory 202b to carry out the foregoing procedure. According to some implementations the controller takes into account the temperature of at least one of the IGBTs 101a, 101b, 101c when determining the extent the valve 117 is opened at the onset of the time interval.

The method further includes reinitiating the delivery of current through the IGBTs to the torch electrode when the $C_{off}$ time interval has ended and the $C_{on}$ time interval begins. When this occurs, the valve 117 is caused to assume the first position such that at least a majority or all of the fluid again passes through the heat exchanger 114.

As shown in FIG. 5, according to one implementation the torch 108 and associated fluid conduits 140c and 140d are located outside a housing 150 in which the remainder of the components are located. According to such an implementation, the conduits 140c and 140d are respectively coupled to conduits 140b and 140e by coupling devices 160a and 160b that protrude from or extend through a wall of the housing 150. According to some implementations the coupling devices 160a and 160b are quick connect couplers.

According to some implementations the heat exchanger 114 is a radiator (as shown in the example of FIG. 5) having a cooling fan 115 that forces air over the radiator coils 114c that carry the fluid 103. The fan is driven by an electric motor 115a and the controller 202 is configured to turn the fan motor 115a on and off based on the state of the IGBTs. According to one implementation, in addition to causing the valve to assume the second position, the controller 202 is configured to cause a cessation of power to the fan motor 115a during a time the IGBTs are powered off. As shown in FIG. 8, the controller 202 may be configured to control the open and closed position of a switch 208 that controls the delivery of power to the radiator fan motor 115a.

According to another implementation, the system is devoid of a radiator bypass conduit and the IGBT junction temperature fluctuations ($\Delta T_j$) are controlled by turning the radiator fan motor 115a on and off at selected times. According to one implementation this involves turning the fan motor off at or near the time current flow to the torch electrode 111 is terminated (i.e. at the onset of $C_{off}$). According to another implementation this involves turning the fan motor off at a time interval before current flow to the torch electrode 111 is terminated. In each of these implementations the cooling of the fluid 103 passing through the radiator is diminished, resulting in a warmer fluid being circulated through the fluid circuit at the time IGBT current is terminated. Because the IGBT cooling plates 120a, 120b, 120c are operated at a warmer temperature, the junction temperature of the respective IGBTs 101a, 101b 101c attached to them will drop a smaller amount when the IGBTs are turned off.

According to other implementations IGBT junction temperature fluctuations can be managed by regulating the pump 104. As explained above, this can be an "on" and "off" regulation wherein power to the pump is turned off at the time of or at a time interval after terminating power to the IGBTs. According to some implementations, the pump 104 is a variable flow pump that is controlled by the controller 202 to vary the flow rate of the fluid 103 in the fluid circuit. In such implementations the flow rate of the fluid is reduced at the time of or at a time interval after terminating power to the IGBTs. As shown in FIG. 8, the controller 202 may be configured to control the open and closed position of a switch 210 that controls the delivery of power to the motor that drives the pump 104.

The terms "upstream" and "downstream" are used throughout this disclosure to indicate the relative position of system components in regard to the direction of the fluid flow. The term "downstream" indicates a position in a direction of fluid flow and "upstream" indicates a position in a direction opposite the fluid flow.

What is claimed is:

1. A system comprising:
  an IGBT that is configured to deliver current to an electrode of a cutting or welding torch, the IGBT being thermally coupled to a cooling plate to which a fluid is configured to flow to regulate a temperature of the IGBT; and
  a cooling system through which the fluid is circulated, the cooling system including:
    a heat exchanger configured to cool the fluid as the fluid passes therethrough;
    a bypass conduit having a fluid inlet and a fluid outlet, the fluid inlet of the bypass conduit being located upstream of the heat exchanger, the fluid outlet of the bypass conduit being located downstream of the heat exchanger and upstream of the cooling plate; and
    a valve located in the bypass conduit that is configured to transition between a first position and a second position, the bypass conduit and the valve being configured such that when the valve is in the second position a first amount of the fluid is diverted away from the heat exchanger and flows through the bypass conduit, wherein when the valve is in the first position, none of the fluid flows through the bypass conduit, wherein the valve is configured to be electrically actuated to assume one or both of the first position and the second position, the system further comprising a controller that is configured to cause the valve to assume the second position upon a termination of delivery of current through the IGBT to the electrode, wherein the controller is further configured to cause the valve to assume the second position a duration of time before a designated time for the termination of delivery of current through the IGBT to the electrode, the duration of time being sufficient to cause heat dissipated by the electrode and the IGBT to cause an increase in temperature of the fluid disposed in a tank for storing at least some of the fluid for the cooling system before the termination of delivery of current through the IGBT.

2. The system according to claim 1, wherein the heat exchanger is a radiator having a cooling fan that is driven by a motor and the controller is further configured to cause a cessation of power to the motor during a time when the valve is in the second position.

3. A system comprising:

an IGBT that is configured to deliver current to an electrode of a cutting or welding torch, the IGBT being thermally coupled to a cooling plate to which a fluid is configured to flow to regulate a temperature of the IGBT; and a cooling system through which the fluid is circulated, the cooling system including:

a heat exchanger configured to cool the fluid as the fluid passes therethrough;

a bypass conduit having a fluid inlet and a fluid outlet, the fluid inlet of the bypass conduit being located upstream of the heat exchanger, the fluid outlet of the bypass conduit being located downstream of the heat exchanger and upstream of the cooling plate; and a valve located in the bypass conduit that is configured to transition between a first position and a second position, the bypass conduit and the valve being configured such that when the valve is in the second position a first amount of the fluid is diverted away from the heat exchanger and flows through the bypass conduit, wherein the valve is electrically actuated and transitional between the first position, the second position, and a third position, and the system further comprising a controller that is configured to cause the valve to assume at least the second position and the third position, wherein the controller is configured to:

cause the valve to assume the second position a duration of time before a designated time for a termination of delivery of current through the IGBT to the electrode, the duration of time being sufficient to cause an increase in temperature of the fluid disposed in a tank for storing at least some of the fluid for the cooling system before the termination of delivery of current to the IGBT; and cause the valve to assume the third position when or after the duration of time, wherein, when the valve is in the third position, a second amount of the fluid is diverted away from the heat exchanger and flows through the bypass conduit, the second amount being greater than the first amount.

4. The system according to claim 3, wherein when the third position of the valve is a fully open position.

5. The system according to claim 1, further comprising:

a torch in which the electrode resides, the torch having a cooling channel through which the fluid is configured to flow to cool the electrode; and a pump located upstream and in fluid communication with a fluid inlet of the cooling channel while the heat exchanger is located downstream and in fluid communication with a fluid outlet of the cooling channel.

6. A method for controlling a temperature of an IGBT that is configured to deliver current to an electrode of a cutting or welding torch, comprising:

causing a valve to assume a first position when current is delivered through an IGBT to an electrode of a cutting or welding torch, the first position of the valve causing cooling fluid to flow sequentially through a cooling channel of the cutting or welding torch, a heat exchanger of a cooling system, a cooling plate of the cooling system that is thermally coupled to the IGBT, and a tank of the cooling system; and causing the valve to assume a second position a duration of time before a designated time for a termination of delivery of current through the IGBT to the electrode, the second position of the valve being configured to divert a first amount of the cooling fluid away from the heat exchanger via a bypass conduit having a fluid inlet located upstream of the heat exchanger and a fluid outlet located between the heat exchanger and the cooling plate, wherein the duration of time is sufficient to cause an increase in temperature of the cooling fluid disposed in the tank of the cooling system before the termination of delivery of current through the IGBT.

7. The method according to claim 6, wherein when the valve is in the first position no cooling fluid flows through the bypass conduit.

8. The method according to claim 6, wherein when the valve is in the first position at least a majority of the cooling fluid flows through the heat exchanger and when the valve is in the second position at least a majority of the cooling fluid flows through the bypass conduit.

9. The method according to claim 6, further comprising maintaining the valve in the second position during the termination of delivery of current through the IGBT.

10. The method according to claim 9, further comprising reinitiating delivery of current through the IGBT to the electrode and causing the valve to assume the first position when the valve is in the first position.

11. The method according to claim 6, wherein the heat exchanger is a radiator having a cooling fan driven by a motor and the method further comprises terminating power to the motor during a time when the valve is in the second position.

* * * * *